United States Patent
Beltrami et al.

(10) Patent No.: US 7,710,778 B2
(45) Date of Patent: May 4, 2010

(54) NAND FLASH MEMORY WITH REDUCED PROGRAMMING DISTURBANCE

(76) Inventors: Silvia Beltrami, Via Don G. Brugnetti, 13, Sorisole, BG (IT) I-24010; Angelo Visconti, Via Colombo, 27, Appiano Gentile, CO (IT) I-22070

(*) Notice: Subject to any disclaimer, the term of this patent is extended or adjusted under 35 U.S.C. 154(b) by 16 days.

(21) Appl. No.: 11/901,596

(22) Filed: Sep. 17, 2007

(65) Prior Publication Data
US 2008/0068890 A1 Mar. 20, 2008

(30) Foreign Application Priority Data
Sep. 15, 2006 (EP) ................. 06120719

(51) Int. Cl.
*G11C 11/34* (2006.01)
(52) U.S. Cl. .............. 365/185.17; 365/185.18; 365/185.2; 365/185.27; 365/185.29; 365/185.33
(58) Field of Classification Search ............ 365/185.11, 365/185.17, 185.18, 185.27, 185.29, 185.33, 365/185.2
See application file for complete search history.

(56) References Cited

U.S. PATENT DOCUMENTS

| | | | | |
|---|---|---|---|---|
| 5,745,417 | A * | 4/1998 | Kobayashi et al. | 365/185.29 |
| 5,986,939 | A * | 11/1999 | Yamada | 365/185.29 |
| 6,388,921 | B1 * | 5/2002 | Yamamoto et al. | 365/185.29 |
| 6,914,813 | B2 * | 7/2005 | Chevallier et al. | 365/185.29 |
| 7,239,556 | B2 * | 7/2007 | Abe et al. | 365/185.17 |
| 7,263,000 | B2 * | 8/2007 | Hazama et al. | 365/185.29 |
| 7,349,249 | B2 * | 3/2008 | Honma et al. | 365/185.29 |
| 2004/0113199 | A1 | 6/2004 | Hazama et al. | |
| 2005/0122780 | A1 | 6/2005 | Chen et al. | |
| 2005/0180213 | A1 | 8/2005 | Abe et al. | |
| 2007/0223273 | A1 * | 9/2007 | Kang et al. | |

OTHER PUBLICATIONS

European Search Report for EP 06 12 0719 dated Feb. 15, 2007.
Communication pursuant to Article 94(3) EPC from European Patent Application No. 06120719.7-1233 / 1901308 mailed Nov. 24, 2008, 1 pg.

* cited by examiner

*Primary Examiner*—Trong Phan
(74) *Attorney, Agent, or Firm*—Blakely, Sokoloff, Taylor & Zafman LLP

(57) ABSTRACT

An embodiment of a flash memory device with NAND architecture, including a matrix of data storage memory cells each one having a programmable threshold voltage, wherein the matrix is arranged in a plurality of rows and columns with the memory cells of each row being connected to a corresponding word line and the memory cells of each column being arranged in a plurality of strings of memory cells, the memory cells in each string being connected in series, the strings of each column being coupled to a reference voltage distribution line distributing a reference voltage by means of a first selector, wherein each string further includes at least one first shielding element interposed between the memory cells of the string and said first selector, the first shielding element being adapted to shield the memory cells from electric fields that, in operation, arise between the string of memory cells and the first selector.

20 Claims, 1 Drawing Sheet

NAND FLASH MEMORY WITH REDUCED PROGRAMMING DISTURBANCE

PRIORITY CLAIM

This application claims priority from European patent application No. EP06120719.7, filed Sep. 15, 2006, which is incorporated herein by reference.

TECHNICAL FIELD

An embodiment of the present invention relates to the electronics field. More specifically, an embodiment of the present invention relates to memory devices.

BACKGROUND

Memory devices are commonly used to store data either temporarily or permanently in a number of applications; for example, in a non-volatile memory device, the data is preserved even when a memory device power supply is off.

Flash memory devices are non-volatile memories wherein each single memory cell may be programmed electrically, but a large number of memory cells, forming a memory block, are erased at the same time. Typically, each memory cell consists of a floating-gate MOS transistor, which stores a logic value defined by its threshold voltage (which depends on the electric charge stored on the floating gate).

In particular, during the programming of the floating-gate MOS transistor, electrons are injected, for example, by means of the known Fowler-Nordheim mechanism, into the floating gate; the retention of such electrons by the floating gate causes the memory device non-volatility. Vice versa, during the erasing, the floating gate is substantially emptied of the electrons, which were injected during the programming.

In a flash memory device with NAND architecture, the memory cells are grouped in strings (or stacks), each one consisting of a set of memory cells that are connected in series between a drain select transistor, connected to a bit line of the memory cells block, and a source select transistor, connected to a reference voltage distribution line distributing a reference voltage (such as a ground voltage); groups of said strings of memory cells are connected to a same bit line, and thus they are connected in parallel to each other. When all the memory cells belonging to a same string are to be programmed, usually the first memory cell that undergoes the programming operation is the memory cell connected to the source select transistor of the string, followed by the subsequent memory cells of the string proceeding towards the memory cell connected to the drain select transistor.

As known, for programming a memory cell belonging to the selected string, a significantly high programming voltage (such as 18V) is applied to its control gate, while control gates of the remaining memory cells of the string are driven by a programming pass voltage, typically lower (such as, 9 or 10V) than the programming voltage, but sufficient to turn them on. The bit line corresponding to the selected string is biased at a voltage that depends on the data to be programmed into the considered memory cell: if the data to be programmed is a "0" (by convention, corresponding to a memory cell with a positive threshold voltage), the bit line is biased at the reference voltage (such as 0V); if instead the memory cell is intended to store a "1" (which, by convention, corresponds to an erased memory cell, with a negative threshold voltage; thus, when the data to be stored is a "1", the corresponding memory cell is left in the original state), the bit line is biased at a higher voltage, such as the memory device supply voltage (e.g., 3V). The other bit lines of the memory matrix are brought to the supply voltage. The control terminal of the drain select transistor corresponding to the selected string is driven by the supply voltage, thus in case the data to be programmed is a "0" the drain select transistor is turned on, whereas in case the memory cell is intended to store a "1" the drain select transistor is kept off. The source select transistor receives at its control terminal the reference voltage, thus resulting in the select transistor being turned off.

In detail, when a logic value equal to "0" is to be stored into the selected memory cell, the threshold voltage thereof is shifted towards higher values compared to the erased state (that corresponds to a logic "1"). For this purpose, electrons are to be injected into the floating gate; a relatively high voltage difference ("programming voltage") between the control gate and the drain terminal of the selected memory cell is applied. In particular, the drain terminal of the selected memory cell is kept at the reference voltage, since the remaining non-selected memory cells of the string are turned on so as to transfer the reference voltage (i.e., 0V) from the bit line to the drain of the memory cell; the control gate voltage applied to the unselected memory cells of the string is not excessively high, so as to inhibit charge injection into the floating gates thereof.

When the data to be stored into the selected memory cell is a logic value equal to "1", its threshold voltage remains unchanged (under the assumption that the memory cell starts from an erased state). For this purpose, the voltage difference between the control gate and the drain terminal of the selected memory cell is kept lower than the programming voltage, so as to be insufficient for causing a charge injection into the floating gate thereof. All the memory cells in the string are on, and, the drain select transistor being off, the voltage of the drain terminal of the selected memory cell is boosted toward relatively high values (such as, 7V) thanks to the capacitive coupling effect between the selected memory cell and the remaining memory cells of the string.

A function of the memory devices is to ensure that the memory cells are correctly programmed. Indeed, when one (or more) memory cells of the memory device are programmed, corruption of the data stored into the remaining memory cells may occur due to effects like an unexpected and undesired charge injection into the floating gates thereof. Such an event may cause the threshold voltages of the memory cells to take values that are different (higher or lower) than the expected values.

These spurious changes of the memory cells' threshold voltages may cause errors when the data is read. Such effect, which is also experienced in NAND memories with two-level memory cells, is more and more of a problem in multi-level NAND memories, wherein each cell stores multiple bits, corresponding to multiple different threshold voltage levels; in this case in fact the margins which are available for discriminating the different stored logic values are reduced.

For better clarity, let the case be considered of a programming operation performed on a memory cell belonging to a selected string of a NAND flash memory device. Let it be assumed that the memory cell to be programmed is the second (starting from the source select transistor) memory cell in the string, whereas the first memory cell has already been programmed. As mentioned above, during the program operation, the control gate of the first memory cell—the one which is directly connected to the source select transistor—is driven by the programming pass voltage, whereas the control gate of the second memory cell is driven by the programming voltage.

The voltage of the drain terminals of the memory cells belonging to the unselected string is boosted toward relatively high values (such as, 7V). In particular, the drain terminal of the first memory cell belonging to the unselected string is boosted to said relatively high values (such as, 7V) thanks to the capacitive coupling effect with the remaining memory cells of the string. The voltage difference between the programming pass voltage and the voltage (i.e., the reference voltage) applied to the control electrode of the source select transistor may cause an undesired charge injection (so-called "Source/drain Hot-Carrier Injection Disturbance", or SDHCID for short) into the floating gate of the first memory cell of the unselected string, which may vary its threshold voltage. In particular, electron-hole pairs may be generated at the source select transistor and the generated electrons are accelerated towards the floating gate of the (first) memory cell belonging to the unselected string so causing an undesired programming thereof. This phenomenon is more apt to occur the higher the difference between the programming pass voltage and the voltage (i.e., the reference voltage) applied to the control electrode of the source select transistor; in particular, such phenomenon is more apt to occur the higher the transversal electric field between the source select transistor and the unselected memory cells.

Similar problems are encountered when the string includes memory cells which are intended to store a logic value equal to "1" and in particular when the first memory cell of the string is to be left in the erased state. Indeed, also in this case the transversal electric field between the source select transistor and the first memory cell (with the voltage of the drain terminal boosted to a high value) may cause an undesired programming thereof.

In other words, the "SDHCID" affects the threshold voltage of the first memory cells belonging to memory cell strings, which are not selected for the programming operation (meaning both unselected strings and selected strings but containing memory cells that are to left in the "1" state). Indeed, the voltage difference between the programming pass voltage applied to the control gate of the first memory cell of the string and the voltage (i.e., the reference voltage) applied to the control electrode of the source select transistor may cause an undesired charge injection into the floating gate of the first memory cell of each string of the block.

It should be noted that in bi-level memory devices such problem is particularly detrimental when the first memory cell of the string is intended to store a data corresponding to the "1", since even a small charge injection may cause a shift of the threshold voltage towards the programmed state such that the first memory cell, during the reading operation, is non-conductive (i.e., programmed to "0" logic value) instead of conductive (i.e., erased to "1" logic value).

In multi-level memory devices the "SDHCID" is particularly felt also when the data to be stored into the first memory cell belonging to the string, which is not selected for the programming, corresponds to a programmed state. In fact, the undesired charge injection may cause a shift of the threshold voltage of the first memory cell toward threshold voltage levels corresponding to a (programmed) state different from the desired one.

Similar considerations also apply when the program operation is performed on the other memory cells of the selected string.

SUMMARY

A known design rule for reducing the above-mentioned problem provides for keeping a distance between the source select transistors and the corresponding adjacent memory cell significantly high (such as, higher than 110 nm).

But a drawback of the above-described design rule is that keeping the electric field between the source selector transistor and the first memory cell as low as possible to reduce the "SDHCID", by ensuring a sufficiently high distance between the source select transistors and the corresponding adjacent memory cell, may have a detrimental impact on the size of the memory device.

In general terms, an embodiment of the present invention is based on the idea of providing auxiliary memory cells, which are not adapted for storing users' data, being instead provided as a "shield".

An embodiment of the present invention is a flash memory device with NAND architecture, including a matrix of data storage memory cells each one having a programmable threshold voltage. The matrix is arranged in a plurality of rows and columns with the memory cells of each row being connected to a corresponding word line and the memory cells of each column being arranged in a plurality of strings of memory cells, the memory cells in each string being connected in series, the strings of each column being coupled to a reference voltage distribution line distributing a reference voltage by means of a first selector. Each string further includes at least one first shielding element interposed between the memory cells of the string and said first selector, the first shielding element being adapted to shield the memory cells from electric fields that, in operation, arise between the string of memory cells and the first selector.

DETAILED DESCRIPTION

Figure 1:
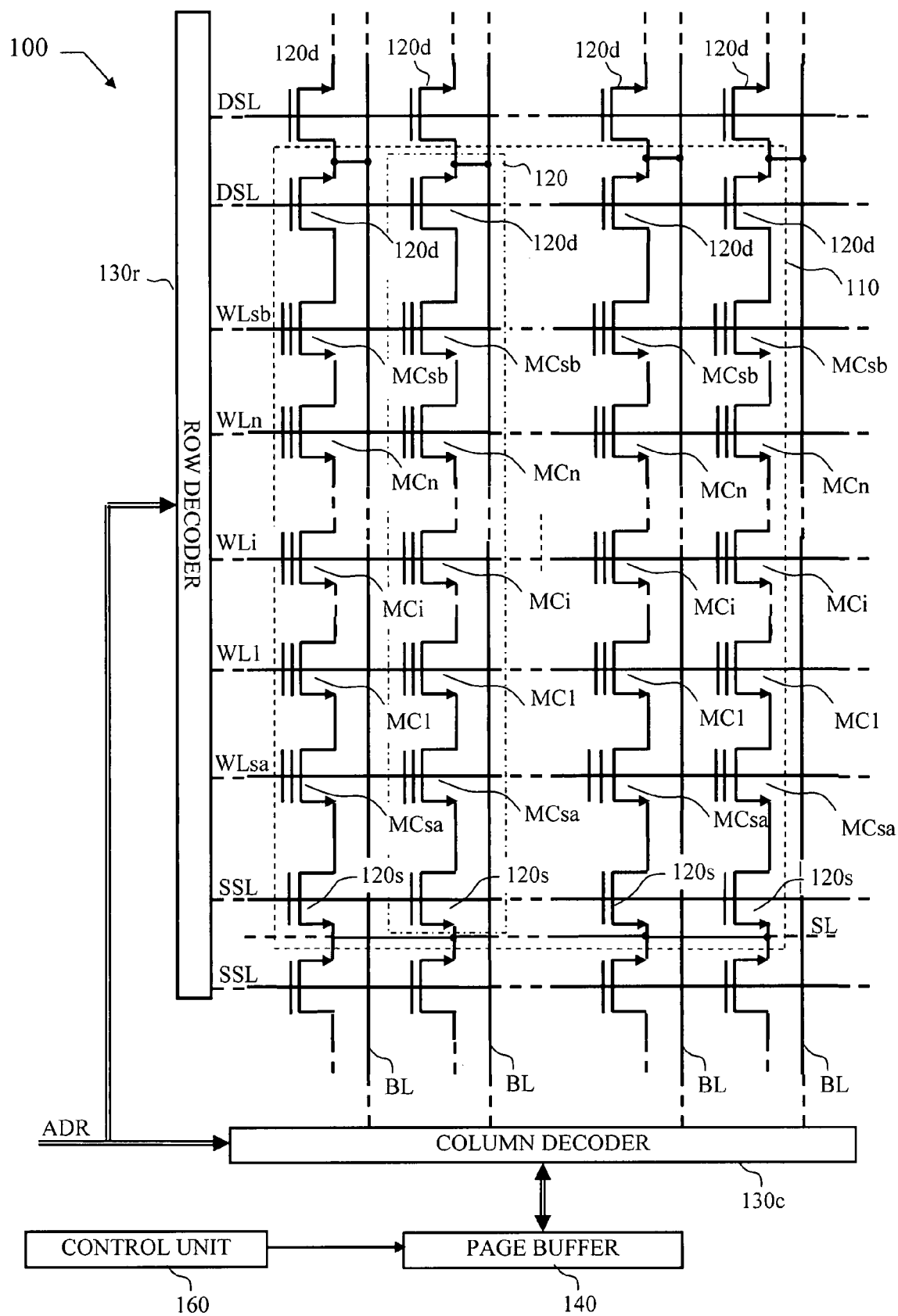
FIG. 1 shows a semiconductor device according to an embodiment of the present invention.

With reference to FIG. 1, a non-volatile memory device of the flash type 100 according to an embodiment of the present invention is shown. The memory device 100 includes a plurality of memory cells conventionally arranged in row and columns to form a matrix. Each memory cell is intended to store users' data, and consists of a floating-gate MOS transistor.

The memory cells of the memory matrix are grouped in one or more memory blocks 110, each memory block being erasable individually.

The memory device 100 is for example a bi-level memory, wherein each memory cell is adapted to store a logic value of one bit. The state of the generic memory cell is defined by its threshold voltage; in the example at issue, the threshold voltage of the generic memory cell may take one of two different levels. In an erased condition each memory cell has a negative threshold voltage (to which a logic value "1" is typically associated). The memory cell is programmed by injecting electrons into its floating-gate; in the programmed condition the memory cell has a positive threshold voltage (to which a logic value "0" is typically associated). Therefore, when the generic memory cell is biased for reading, it is conductive if erased or it is non-conductive if programmed.

The memory device 100 has NAND architecture. In this configuration, each memory block 110 includes a plurality of strings 120 of memory cells; each memory cell string 120 includes a corresponding set of memory cells MC1 . . . MCn, for example 16 or 32 memory cells, that are connected in series between a source select transistor 120*s* and a drain select transistor 120*d*. More in detail, an intermediate cell MCi (for i: 1 ... n) of each string 120 has a drain terminal connected to a source terminal of an upper memory cell MCi+1 and a source terminal connected to a drain terminal of a lower memory cell MCi−1.

The source terminals of the drain select transistors 120d of the strings of a same matrix column are connected to a corresponding bit line BL.

The source terminal of all the source select transistors 120s of the strings of the block 110 are connected to a common source line SL, which is typically maintained at the reference voltage (or ground).

The gate terminals of the memory cells MCi (for i: 1 ... n) of a same matrix row are connected to a corresponding word line WLi (for i: 1 ... n). The gate terminals of the drain select transistors 120d positioned on a same row are connected to a corresponding drain select line DSL. Likewise, the gate terminals of the source select transistors 120s positioned on a same row are connected to a corresponding source select line SSL.

According to an embodiment of the present invention, in order to limit or eliminate the above-discussed "SDHCID" on the memory cells belonging to the unselected string (i.e., a string which is not selected for programming the memory cells thereof to "0"), the first memory cell MC1 of the generic memory cells string 120 has a source terminal connected to a drain terminal of a source-side shielding memory cell MCsa, which has a source terminal connected to a drain terminal of the respective source select transistor 120s. The source-side shielding memory cell MCsa is adapted to shield the memory cell MC1 against program disturbances, as will be described in detail later on.

Within the memory matrix, the source-side shielding memory cells MCsa belonging to the various memory cells strings 120 are arranged in rows. The gate terminals of the source-side shielding memory cells MCsa of each row are connected to a corresponding shielding word line WLsa. Each memory cell MCi (for i: 1 ... n) and each source-side shielding memory cell MCsa has a corresponding bulk terminal (not shown in FIG. 1) which receives a bulk biasing voltage (common for each memory cell MCi and each source-side shielding memory cell MCsa of the block 110) whose value depends on the operation has to be performed on the memory device 100. For example, during the reading and program operations the bulk terminals are brought to the reference voltage (0V) whereas during the erase operations the bulk terminal is brought to an erasing voltage (such as, 19V).

It has also been observed that for the same above-mentioned reasons (relating to the first memory cell MC1) the "SDHCID" may also affect the last memory cell MCn in the string, thereby causing an undesired shift of its threshold voltage value. In order to overcome this problem, according to an embodiment of the present invention, a further drain-side shielding memory cell MCsb is provided in each memory cell string 120. In particular, the last memory cell MCn of each string 120 has a drain terminal connected to a source terminal of the drain-side shielding memory cell MCsb, which has a drain terminal connected to a drain terminal of the drain select transistor 120d. The gate terminals of the drain-side shielding memory cells MCsb of each row are connected to a corresponding shielding word line WLsb.

The shielding memory cells MCsa and MCsb are structurally identical to the memory cells MC1 ... MCn of the block 110 but are not intended to store users' data, and are not exploited to this end; they are, from the data storage viewpoint, dummy cells.

The memory device 100 further includes a page buffer 140, which is used for reading and for writing data from/into selected memory cells MCi.

The memory device 100 receives an address ADR for selecting the desired memory cells. A portion of the address ADR is supplied to a row decoder 130r that selects the word line WLi (for i: 1 ... n), the shielding word lines WLsa and WLsb, the drain select line DSL and the source select line SSL of the corresponding strings. Another portion of the address ADR is supplied to a column decoder 130c; the column decoder 130c selects and connects the desired bit lines BL to the page buffer 140.

Operation of the flash memory 100 is managed by a control unit 160.

During a reading operation, considering a memory cell MCi, the drain select transistor 120d and the source select transistor 120s of the selected string 120 to which the considered memory cell belongs are turned on. For this purpose, the drain select line DSL, the source select line SSL and the bit line BL of the selected string 120 are brought to proper biasing voltages, such as the supply voltage Vdd, so as to turn on the drain select transistor 120d and the source select transistor 120s, respectively; the source line SL is brought to the reference voltage (0V). The selected word line is brought to a reference reading voltage, intermediate between the range of threshold voltages corresponding to the erased ("1") state and the range of threshold voltages corresponding to the programmed ("0") state (in the example of a bi-level memory device); for example, the reference reading voltage may be 0V, under the assumption that threshold voltage of an erased memory cell is negative; the other word lines of the corresponding strings are brought to a passing reading voltage Vread (for example, 5 V) so that the respective memory cells are always conductive (independently from their threshold voltage). At the same time, the shielding word line WLsa and WLsb are biased to a voltage sufficiently high to ensure that they are conductive; for example, the shielding word line WLsa and WLsb are biased to the passing reading voltage Vread as are the non-selected word lines (it is observed that too high a voltage applied to the shielding word lines may induce an increase in threshold voltage of the shielding memory cells; applying to the shielding word lines the same voltage that is applied, during reading, to the non-selected word lines of the string typically ensures that disturb of the threshold voltage of the shielding memory cells is kept within the limits set forth for the non-selected memory cells MCi). Moreover, the bulk terminal is brought to the reference voltage (0V).

At the same time, the drain select transistor 120d and the source select transistor 120s of each string 120 belonging to different blocks 110, other than the block to which the selected string belongs, are turned off. For this purpose, the drain select line DSL, the source select line SSL of the unselected strings 120 are brought to proper biasing voltages, such as the reference voltage, so as to turn off the drain select transistor 120d and the source select transistor 120s, respectively; the source line SL is brought to the reference voltage (0V). Moreover, all the word lines WL1 ... WLn and the shielding word lines WLsa and WLsb receive the reference voltage, so that all the memory cells are turned off.

The selected memory cell will be conductive if its threshold voltage is lower then the reference reading voltage applied to its control gate, and not conductive in the opposite case; this allows assessing whether the selected cell stores a "1" or a "0", respectively.

During a program operation, considering a memory cell MCi, when the data to be stored is equal to the "0" logic value, the memory cell MCi is properly biased so that its threshold voltage shifts towards higher values; vice versa, when the data to be stored is equal to the "1" logic value, the memory cell MCi is biased so that the threshold voltage thereof remains substantially unchanged (e.g., the memory cell remains in the erased state). As above, let the case be assumed that the memory cell subjected to the programming operation is the second memory cell MC2 in the string, whereas the first memory cell MC1 (connected to the source-side shielding memory cell MCsa) is already programmed. In case the data to be programmed is "0", the page buffer 140 brings the bit line BL to which the selected memory cell string belongs, to 0V, whereas the other bit lines BL are brought to a higher voltage, for example the supply voltage Vdd (such as, 3V) of the memory device 100.

The desired memory cell string 120 is selected for programming by turning the drain select transistor 120d on, whereas the source select transistor 120s is turned off. For this purpose, the drain select line DSL and the source select line SSL are respectively brought to the supply voltage Vdd and to the reference voltage, and the source line SL is brought to the reference voltage (0V). Alternatively, the source line SL and the source select line SSL can be brought to the supply voltage Vdd so that also in such case the source select transistor 120s is turned off. In any case, the voltages of the source line SL and of the source select line SSL are such that the source select transistor 120s is off.

At same time, the word line WL2 connected to control gate of the memory cell to be programmed is brought to the programming voltage Vpgm (such as, 18V), whereas the remaining word lines WL1, WL3 . . . WLn of the same block 110 are brought to the programming pass voltage Vpass (such as 10V) lower than the programming voltage Vpgm, and adapted to cause the corresponding memory cells MC1, MC3, . . . , MCn of the selected string to be turned on irrespective of their programming state. The bulk terminal of all the memory cells is brought to the reference voltage (0V). The shielding word lines WLsa and WLsb of the selected block 110 are brought to an intermediate voltage V'pass, having a value intermediate between the reference voltage (0V) and the programming pass voltage Vpass (for example, 5V).

In such biasing conditions, the drain terminal of the memory cell MC2 selected for being programmed reaches substantially the reference voltage, so that the relatively high voltage difference between the control gate and the memory cell's drain terminal favors the injection of electrons into the floating gate thereof; the second memory cell MC2 is thus programmed. The remaining memory cells and, in particular, the first memory cell MC1 of each unselected string remain in the preceding state without any significant change of their threshold voltage. Indeed, the first memory cell MC1 of each string which is not selected for programming (i.e., an unselected string, or a string containing a cell to be left in the "1" state) is protected from the "SDHCID" by the source-side shielding memory cell MCsa. In other words, the hot electrons, which may be generated at the source select transistor 120s and are accelerated by the electric field towards the source-side shielding memory cell MCsa, are injected into the floating gate of the source-side shielding memory cell MCsa, not into that of the first memory cell MC1 of the unselected string. In such a way, only the source-side shielding memory cell MCsa may suffer the change of the threshold voltage thereof, so that the state of the first memory cell MC1 is not affected. However, such a programming of the source-side shielding memory cell MCsa typically does not impair the reliability of the memory device 100, since the shielding memory cells MCs are not used for storing user' data.

It should be noted that the intermediate voltage V'pass is intentionally chosen to be lower than the programming pass voltage Vpass, so that the programming of the source-side shielding memory cells MCsa caused by the "SDHCID" is less pronounced than in the case the voltage Vpass is used. Ensuring that the threshold voltage of the source-side shielding memory cells MCsa does not increase too much is important not to impair the reading operation: indeed, should the voltage applied to the source shielding word line WLsa be equal or even higher than the programming pass voltage Vpass applied to the other word lines, a non-negligible shift of the threshold voltage of the source-side shielding memory cell MCsa may occur. In this case, during the reading operation of a selected memory cell of the string, the source-side shielding memory cell MCsa may be excessively programmed, thus causing the whole selected string 120 to be nonconductive independently of the states of the memory cells MCi.

On the other hand, the shielding voltage V'pass should be sufficiently high, compared to the reference voltage (i.e., 0V) so that an unexpected charge injection from the source-side shielding memory cell MCsa to the first memory cell MC1 is avoided (otherwise, the first memory cell might experience a threshold value disturb caused by the "SDHCID" between the source-side shielding memory cell MCsa and the first memory cell MC1).

Similar considerations apply to the memory cells MCn−1 and MCn of each string. Let the case be considered of a programming operation performed on the memory cell MCn−1. In such case, the drain-side shielding memory cell MCsb shields the last memory cell MCn of the string which is not selected for programming from an undesired change of its threshold voltage (due to the voltage difference between the programming pass voltage applied to the control gate of the last memory cell MCn and the supply voltage applied to the gate electrode of the drain select transistor DSL). This has a beneficial impact when the memory cell MCn belonging to the unselected string is intended to store—during the subsequent program operation—a data corresponding to the "1" logic value. In such case, for storing the "1" logic value, the last memory cell MCn should remain in the erased state and any significant shift of its threshold voltage should be avoided. In particular, since the last memory cell MCn is intended to store the "1" logic value, no possible adjustment of its threshold voltage during the subsequent programming operations is warranted, so that a charge injection into its floating gate may cause a reading error.

During an erase operation of the selected block 110, an erasing pulse Verase is applied to the cells of the sector. In particular, the erasing pulse Verase is applied to the bulk region, for example, with a ramp pattern that starting from 0V reaches 19V in 800 μs, in order to bring the threshold voltage of the memory cells MCi toward low value (to which a logic value "1" is typically associated).

At the same time, the drain select line DSL, the source select line SSL, the bit line BL and the source line SL are floating, whereas all the word lines WL1 . . . WLn and the shielding word lines WLsa and WLsb of each string 120 are brought to the reference voltage (0V). The blocks 110 which are not selected for the erasing operation have all the word line WL1, . . . , WLn and the shielding word line WLsa and WLsb of each string 120 thereof, the bit line BL, the source line SL, the drain select line DSL, the source select line SSL which are floating, whereas the erasing voltage Verase is applied to the bulk terminal of each memory cell MCi and of the shielding memory cells MCsa and MCsb of the blocks.

According to an embodiment of the present invention, the "SDHCID" on the memory cell MCi (for i: 1 ... n) during the program operation is significantly reduced, or even eliminated, by using shielding memory cells that are arranged and operated to shield the memory cells of the string. In particular, in an embodiment of the present invention, a source shielding memory cell is inserted between the source select transistor and the first memory cell of a generic string. In another embodiment of the invention, a further, drain shielding memory cell is further inserted between the last memory cell of the string and the drain select transistor.

It should be noted that the introduction of the one or two shielding memory cells in each string does not significantly increase the size of the chip of the memory device 100, since it is only a matter of one or two rows of cells every 16 or possibly 32 rows of cells; also, in the next generation of NAND memories, the distance between the (source and drain) select transistors and the adjacent memory cell will be already sufficiently large and the introduction of the pair of shielding memory cells MCsa and MCsb adds a negligible contribution to the memory size.

Naturally, in order to satisfy local and specific requirements, a person skilled in the art may apply to the one or more embodiments described above many modifications and alterations. Particularly, although one or more embodiments of the present invention have been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, although in the preceding description reference has been made to the introduction of a pair of shielding memory cells MCsa and MCsb for each string, it is not to be construed as a limitation of the present invention. For example either the source shielding memory cell, or the drain shielding memory cell (where provided), or both of them may be implemented as two or more, serially- or parallely-connected shielding memory cells.

Indeed, an embodiment of the invention is also suitable to be implemented by using a different number of shielding memory cells per string. In particular, since the "SDHCID" is more acute for the memory cells adjacent to the source select transistor, only the source-side shielding memory cells MCsa may be provided in the memory device 100.

It is emphasized that, although for sake of simplicity of the description reference has been made to a two-level memory, it is evident that the proposed solution may be particularly advantageous in a multi-level memory.

The memory device 100 may compose part of an electronic system, such as a computer system, which includes one or more other integrated circuits (ICs), such as a controller, coupled to the memory device. The memory device 100 and the one or more other ICs may be disposed on a same die or on different dies.

The invention claimed is:

1. A flash memory device with NAND architecture, the flash memory device comprising:
    a matrix of data storage memory cells each data storage memory cell having a programmable threshold voltage, the matrix comprising:
        a plurality of rows and columns with the memory cells of each row being connected to a corresponding word line and the memory cells of each column being arranged in a plurality of strings of memory cells, the memory cells in each string being connected in series, the strings of each column being coupled to a reference voltage distribution line distributing a reference voltage by a first selector, wherein each string further includes at least one first shielding element interposed between the memory cells of the string and said first selector, the first shielding element receiving a shielding voltage and configured to shield the memory cells from electric fields that, during reading and program operations, arise between the string of memory cells and the first selector; and
    wherein: the reference voltage having a magnitude that is less than the magnitude of the shielding voltage.

2. The memory device according to claim 1, wherein the strings of each column are coupled to a corresponding bit line by a second selector, each string including at least one second shielding element interposed between the memory cells of the string and said second selector, said second shielding element configured to shield the memory cells from electric fields that, during reading and program operations, arise between the string of memory cells and the second selector.

3. The memory device according to claim 2, wherein the at least one first shielding element includes at least one dummy memory cell structurally similar to the data storage memory cells.

4. The memory device according to claim 3, wherein the at least one second shielding element includes at least one dummy memory cell structurally similar to the data storage memory cells.

5. The memory device according to claim 4, wherein the matrix of memory cells includes at least one individually erasable sector, and wherein the memory cells, the first shielding element and the second shielding element belonging to each string of the at least one sector have a corresponding bulk terminal, the memory device further including means for erasing the at least one sector, said means for erasing being adapted to apply the reference voltage to the dummy cells of the first and second shielding elements, and to the word lines connected to the memory cells of the at least one sector, and to apply an erasing voltage to the bulk terminal of the memory cells, and to the bulk terminal of the dummy cells of the first and second shielding elements.

6. A method of accessing data storage memory cells of a flash memory device with NAND architecture, wherein the memory device includes a matrix of memory cells each one having a programmable threshold voltage, the matrix being arranged in a plurality of rows and columns with the memory cells of each row being connected to a corresponding word line and the memory cells of each column being arranged in a plurality of strings of memory cells with the memory cells of each string being connected in series, the strings of each column being coupled to a reference voltage distribution line distributing a reference voltage by a first selector, the method including:
    providing for each string at least one first shielding element receiving a shielding voltage and interposed between the memory cells of the string and said first selector; and
    using the first shielding element as a shield for shielding the memory cells of the respective string from electric fields that, during reading and program operations, arise between the string of memory cells and the first selector; and
    wherein: the reference voltage having a magnitude that is less than the magnitude of the shielding voltage.

7. The method according to claim 6, wherein the strings of each column being connected to a corresponding bit line by a second selector, further includes the steps of:

providing at least one second shielding element interposed between the memory cells of the string and said second selector; and using the second shielding element as a shield for shielding the memory cells of the respective string from electric fields that, during reading and program operations, arise between the string of memory cells and the second selector.

8. The method according to claim 6, wherein either one or both of said first and second shielding elements include each at least one respective dummy memory cell structurally identical to the data storage memory cells.

9. The method according to claim 8, wherein the matrix of memory cells includes at least one sector individually erasable, and the memory cells, the first shielding element and the second shielding element have a corresponding bulk terminal, the method including:

selecting at least one sector;

applying the reference voltage to the dummy-cells of the first and second shielding elements, and to the word lines connected to the memory cells of the at least one sector; and applying an erasing voltage to the bulk terminal of the memory cells, and to the bulk terminal of the dummy cells of the first and second shielding elements.

10. An integrated circuit, comprising:
a data node;
a reference node;
a first nonvolatile memory cell coupled between the data node and the reference node;
a data selector coupled between the first nonvolatile memory cell and the data node;
a reference selector coupled between the first nonvolatile memory cell and the reference node; and
a first shielding device coupled between the first nonvolatile memory cell and one of the data selector and the reference selector, the first shielding device receiving a shielding voltage and configured to shield the first nonvolatile memory cell from electric fields that, during reading and program operations, arise between the first nonvolatile memory cell and one of the data selector and the reference selector; and
wherein: the reference voltage having a magnitude that is less than the magnitude of the shielding voltage.

11. The integrated circuit of claim 10, further comprising:
a bit line coupled to the data node; and
a source line coupled to the reference node.

12. The integrated circuit of claim 10, further comprising a second nonvolatile memory cell serially coupled between the first nonvolatile memory cell and one of the data and reference the data selector and the reference selector.

13. The integrated circuit of claim 10 wherein:
the data selector comprises a first transistor; and
the reference selector comprises a second transistor.

14. The integrated circuit of claim 10 wherein the shielding device comprises a second nonvolatile memory device from which data is not read.

15. The integrated circuit of claim 10, further comprising a second shielding device coupled between the first nonvolatile memory cell and the other of the data selector and the reference selector, the second shielding device configured to shield the first nonvolatile memory cell from electric fields that, during reading and program operations, arise between the first nonvolatile memory cell and the other of the data selector and the reference selectors.

16. A system, comprising:
a first integrated circuit including:
a data node;
a reference node;
a first nonvolatile memory cell coupled between the data node and the reference node;
a data selector coupled between the first nonvolatile memory cell and the data node;
a reference selector coupled between the first nonvolatile memory cell and the reference node; and
a first shielding device coupled between the first nonvolatile memory cell and one of the data selector and the reference selector, the first shielding device receiving a shielding voltage and configured to shield the first nonvolatile memory cell from electric fields that, during reading and program operations, arise between the first nonvolatile memory cell and one of the data selector and the reference selector; and
a second integrated circuit coupled to the first integrated circuit; and
wherein: the reference voltage having a magnitude that is less than the magnitude of the shielding voltage.

17. The system of claim 16 wherein the second integrated circuit comprises a controller.

18. A method, comprising:
generating a programming voltage on a control node of a first nonvolatile memory cell;
generating a shielding voltage on a control node of a shielding transistor that is serially coupled to the first nonvolatile memory cell, the shielding voltage having a magnitude that is less than a magnitude of the programming voltage, wherein the shielding transistor is configured to shield the first nonvolatile memory cell from electric fields that, during reading and program operations, arise between the first nonvolatile memory cell and one of the control node and a reference node; and
generating a non-programming voltage on a control node of a second nonvolatile memory cell that is serially coupled between the first memory cell and the shielding transistor, the non-programming voltage having a magnitude that is between the magnitudes of the programming and shielding voltages.

19. The method of claim 18, further comprising:
isolating the shielding transistor from the reference node with an inactive transistor; and
generating on the reference node a reference voltage having a magnitude that is less than the magnitude of the shielding voltage.

20. The method of claim 18, further comprising:
coupling the shielding transistor to a data line with an active transistor; and
generating on the data line a data voltage having a magnitude that is less than the magnitude of the shielding voltage.

* * * * *